United States Patent [19]

Hartman et al.

[11] 4,447,744
[45] May 8, 1984

[54] CONTROL CIRCUITRY FOR HIGH VOLTAGE SOLID-STATE SWITCHES

[75] Inventors: Adrian R. Hartman, New Providence; James E. Kohl, North Brunswick, both of N.J.; William F. MacPherson, Winfield Township, DuPage County, Ill.; Terence J. Riley, Wyomissing, Pa.

[73] Assignee: Bell Telephone Laboratories, Incorporated, Murray Hill, N.J.

[21] Appl. No.: 333,434

[22] Filed: Dec. 22, 1981

[51] Int. Cl.³ .................. H03K 17/12; H03K 17/72
[52] U.S. Cl. .................. 307/252 R; 307/252 A; 307/305; 357/38
[58] Field of Search .......... 307/252 R, 252 A, 252 C, 307/252 T, 305, 304, 571; 357/22, 38, 58

[56] References Cited

U.S. PATENT DOCUMENTS 4,345,163  8/1982  Davis et al. .................. 307/252 A
4,349,751  9/1982  Hartman et al. .............. 307/252 A

*Primary Examiner*—John Zazworsky
*Attorney, Agent, or Firm*—Irwin Ostroff

[57] ABSTRACT

Control circuitry used with the combination of a control switch (typically a gated diode switch GDS) which is coupled to a control (gate) terminal of a like load switch which consists essentially of first and second p-n-p transistors. The collector of the first p-n-p transistor is coupled to an anode of the control switch. The emitter of the first p-n-p transistor is coupled to the base of the second p-n-p transistor and to a control circuitry input terminal. The collector of the second p-n-p transistor is coupled to a gate terminal of the control switch. The control circuitry limits undesirable current flow into the load switch and has fewer components than commonly used control circuitry which performs a like function.

10 Claims, 2 Drawing Figures

CONTROL CIRCUITRY FOR HIGH VOLTAGE SOLID-STATE SWITCHES

TECHNICAL FIELD

This invention relates to control circuitry for controlling solid-state switches and, in particular, to control circuitry for controlling the state of solid-state switches which have high voltage and relatively high current capabilities.

BACKGROUND OF THE INVENTION

U.S. Pat. No. 4,250,409, which has a common assignee with the present application, describes control circuitry for controlling the state of high voltage and relatively high current capability solid-state switches such as the gated diode switches (GDS's) described in the article entitled "A 500 V Monolithic Bidirectional 2×2 Crosspoint Array," 1980 *IEEE International Solid-State Circuits Conference—Digest of Technical Papers* pages 170 and 171. The control circuitry consists of a moderate number of transistors and a current limiter element. One problem with this control circuitry is that somewhat undesirable current levels are injected into the load switches and the circuits associated therewith because of variations in the current limiter.

It is desirable to have circuitry which performs the same basic function as the above-described control circuitry but which limits undesirable current flow into the load switches and circuits associated therewith and which requires fewer components and less silicon area for implementation.

SUMMARY OF THE INVENTION

The present invention is directed to control circuitry used with a control switch (GDSC) which is coupled by an output terminal to the control terminal of a like load switch (GDSL1 or GDSL2). The control and load switch each have a control terminal and first and second output terminals. In a preferred embodiment these switches are gated diode switches whose output terminals are the anode and cathode and whose control terminal is the gate. The control circuit of the present invention comprises essentially two switching devices (Q2 and Q3) which each have a control terminal and first and second output terminals. In a one embodiment, the first and second switching devices are p-n-p type bipolar transistors. The base of Q2 and the emitter of Q3 are coupled together to an input terminal. The emitter of Q2 and the base of Q3 are coupled to a common terminal. The collector of Q3 is coupled to the anode of GDSC and the collector of Q2 is coupled to the gate of GDSC. Q2 and Q3 serve essentially to control the state of GDSC.

These and other features and advantages of the invention are better understood from a consideration of the following detailed description taken in conjunction with the accompanying drawing.

DETAILED DESCRIPTION

Figure 1:
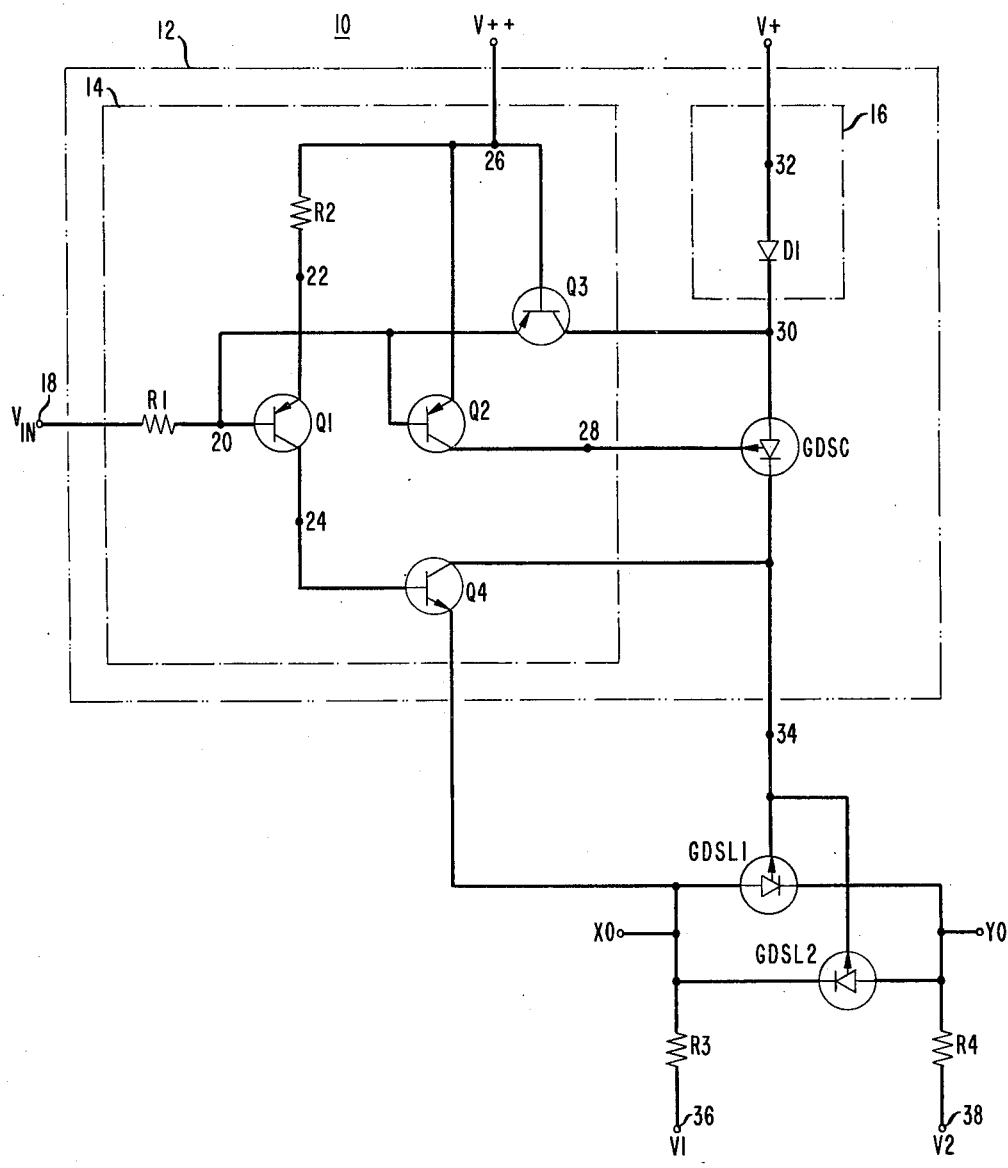
FIG. 1 illustrates a switching system in accordance with one embodiment of the present invention.

Referring now to FIG. 1, there is illustrated a switching system 10 comprising control circuitry 12 (within the largest line rectangle) which is coupled by an output terminal 34 to the gates of a pair of high voltage load (pass) switching devices GDSL1 and GDSL2. The anode of GDSL1 and the cathode of GDSL2 are coupled to a terminal XO and to a first terminal of a resistor R3. A second terminal of R3 is coupled to a terminal 36 and to a potential source V1. The anode of GDSL2 and the cathode of GDSL1 are coupled to a terminal YO and to a first terminal of a resistor R4. A second terminal of R4 is coupled to a terminal 38 and to a potential source V2. The combination of GDSL1 and GDSL2 functions as a bidirectional switch which selectively conducts between terminals XO and YO via a relatively low resistance path through GDSL1 or GDSL2. For illustrative purposes, these switches will be assumed to be gated diode switches. Control circuitry 12 functions so as to supply the needed potentials at terminals 34 and XO and to supply the needed potentials and current sourcing or sinking capability necessary to control the states of GDSL1 and GDSL2.

Typically, a gated diode switch (GDS) comprises a semiconductor body having a bulk portion which is of a relatively high resistivity, a first region of a first conductivity type and of a relatively low resistivity, second and third regions of a second conductivity type opposite that of the first conductivity type. The first and third regions are connected to output terminals of the switch. The second region is connected to a control terminal of the switch. The first, second, and third regions are mutually separated by portions of the bulk of the semiconductor body. One typical GDS is illustrated and described in the article entitled "A 500 V Monolithic Bidirectional 2×2 Crosspoint Array," 1980 *IEEE International Solid-State Circuits Conference—Digest of Technical Papers*, pages 170 and 171.

Figure 2:
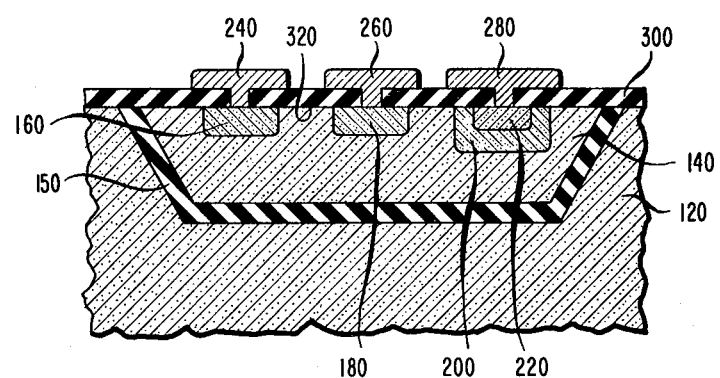
FIG. 2 illustrates a cross-sectional view of a gated diode switch.

Referring now to FIG. 2, there is illustrated a cross-sectional view of a gated diode switch (GDS) 100 which is essentially as is illustrated and described in the above recited article. GDS 100 comprises a semiconductor substrate 120 which has a major surface 320 and is electrically isolated from a semiconductor body 140 by a dielectric layer 150. A bulk portion of semiconductor body 140 is a first conductivity type. Within portions of semiconductor body 140 exist localized regions 160 and 200 which are of the same conductivity type as semiconductor body 140 and further exist localized regions 180 and 220 which are of the opposite conductivity type of the bulk portion of semiconductor body 140. Region 200 encircles region 220 and separates region 220 from semiconductor body 140. Regions 160, 180, and 200 are mutually separated by portions of semiconductor body 140. Separate electrodes 240, 260, and 280 are coupled to regions 160, 180, and 220, respectively. Regions 160, 180, 200, and 220 serve as anode, gate, shield and cathode, respectively, of GDS 100. A dielectric layer 300 exists on surface 320. Electrodes 240 and 280 may be referred to as output terminals and electrode 260 may be referred to as a control terminal. In one typical embodiment semiconductor body 140, regions 160, 180, 200 and 220 are of p−, p+, n+, p, and n+ type conductivity, respectively, electrodes 240, 260, and 280 are aluminum, and dielectric layers 150 and 300 are silicon dioxide.

Control circuitry 12 essentially comprises a high voltage switch GDSC, a first voltage branch circuit 14 (illustrated within a dashed line rectangle), and a second voltage branch circuitry 16 (illustrated within another dashed line rectangle). For illustrative purposes, GDSC is assumed to be a gated diode switch. Branch circuit 14 selectively maintains GDSL1 and GDSL2 in an ON state such that conduction can occur through one or the other GDSL if the potentials of the anode and cathode terminals thereof are sufficient to support conduction, or it can inhibit conduction through both load switches by maintaining the load switches in an OFF state, or it can, for relatively low current flow through GDSL1 and/or GDSL2, cause an interruption of said current flow (switch one of the GDSL's to an OFF state). Branch circuit 16 serves essentially to switch GDSL1 and GDSL2 to an OFF state and, therefore, helps interrupt (cut off) relatively large current flow between terminals XO and YO independent of the potentials applied thereto so long as these potentials are within preselected limits.

Branch circuit 14 comprises p-n-p transistors Q1, Q2, and Q3, n-p-n transistor Q4, and resistors R1 and R2. A Vin input terminal 18 is coupled to a first terminal of R1. A second terminal of R1 is coupled to the bases of Q1 and Q2, the emitter of Q3, and to a terminal 20. The emitter of Q1 is coupled to a first terminal of R2 and to a terminal 22. A second terminal of R2 is coupled to the emitter of Q2, the base of Q3, and to a terminal 26 which is coupled to a power supply V++. The collector of Q1 is coupled to the base of Q4 and to a terminal 24. The collector of Q2 is coupled to the gate of GDSC and to a terminal 28. The collector of Q3 is coupled to the anode of GDSC and to a terminal 30. The emitter of Q4 is coupled to XO, and the collector of Q4 is coupled to the gates of GDSL1 and GDSL2, the cathode of GDSC, and to output terminal 34.

Branch circuit 16 comprises essentially a diode D1 whose cathode is connected to terminal 30 and whose anode is coupled to a terminal 32 and to a power supply V+. Typically, power supply V+ is less positive in potential than power supply V++.

The basic operation of system 10 is as follows: Assuming that GDSL1 and GDSL2 are not conducting and the voltage applied to input terminal 18 is a "1" (which is typically 2.5 volts more positive than V++), then Q1, Q2, and Q4 are biased OFF, and Q3 is biased ON. GDSC is biased ON since the anode thereof (terminal 30) is at a potential close to V++, and the gate terminal is typically floating in potential at the level of V++ or a less positive level. Leakage currents of GDSL1 and GDSL2 can flow from terminal 18 through the emitter-collector of Q3, through the anode-cathode of GDSC, and into the gates of GDSL1 and GDSL2. Approximately the potential level of V++ appears at terminal 34. GDSL1 and GDSL2 are biased OFF and are inhibited from conducting current.

Now assuming that Vin switches from a "1" to "0" (a "0" voltage level being typically 2.2 volts less positive than V++), Q1, Q2, and Q4 are now biased ON, and Q3 is biased OFF. As Q2 becomes biased ON, the potential of the gate of GDSC (terminal 28) increases to approximately V++. The potential of the anode of GDSC (terminal 30), wich had been also at approximately V++, starts to drop since GDSC and Q4 are both ON. The potentials of the anode and cathode of GDSC drop until they are approximately 20 volts below the potential of the gate of GDSC and then GDSC turns OFF. Then, since Q4 is ON, terminal 34 continues to move in potential towards the potential of terminal XO.

Assume now that V1 is at +200 volts and V2 is at ground potential and that V++=+315 volts and V+=+275 volts. As terminal 34 changes in potential to within approximately +20 volts of the potential of terminal XO, GDSL1 turns on and then rapidly causes terminal 34 to moves in potential to approximately the potential of terminal XO. Thus GDSL1 is ON and conducts currents from terminal XO to terminal YO. Alternatively, if the potential of V1 were −200 and the potential of V2 becomes ground, then GDSL2 turns ON and conducts current from terminal YO to terminal XO.

Now, with current flowing through either GDSL1 or GDSL2, assume Vin is switched from a "0" to a "1". Q1, Q2, and Q4 are now switched OFF, and Q3 is switched ON. Initially the gate of GDSC (terminal 28) is at approximately V++, and the anode (terminal 30) is at about 20 volts lower potential. This results in GDSC being in an OFF state. The anode of GDSC then starts to increase in potential towards V++ and GDSC turns ON. The anode, cathode, and gate potentials of GDSC now start to drop as current is sourced into the ON and conducting load gated diode switch (GDSL1 or GDSL2). The gate (terminal 28) of GDSC is held at approximately 0.7 volt below the anode (terminal 30) of GDSC since GDSC is conducting. As the anode of GDSC drops in potential approximately one diode drop below the potential level of V+, D1 becomes conductive and supplies substantial current through GDSC and into terminal 34 and the gate of GDSL1 or GDSL2.

The potential of V+ (terminal 32) and the current being supplied into the gate of GDSL1 or GDSL2 are both preselected to be sufficient to break current flow through the conducting gated diode load switch and thus to turn same OFF. As GDSL1 or GDSL2 turns OFF, the current flowing into the gate thereof is significantly reduced. This allows terminal 30 to rise in potential to approximately the level of V++ and thus reverse biases D1. This cuts off all current flow from V+.

If the level of current flowing through GDSL1 or GDSL2 is sufficiently low, then the relatively modest current flow through Q3 and into GDSC is sufficient to interrupt current flow through GDSL1 or GDSL2, and terminal 30 does not drop sufficiently in potential to forward bias D1.

The combination of transistors Q2 and Q3 controls GDSC and at least partly controls the state of GDSL1 and GDSL2, relatively independent of V+ and D1 and the combination of Q1 and Q4, which are equivalent to corresponding transistors of U.S. Pat. No. 4,250,409.

R3 and R4 serve to limit current which can flow through GDSL1 and/or GDSL2 and to allow for the potential difference between terminals XO and YO to be typically about 2.2 volts when GDSL1 or GDSL2 is ON and conducting.

Switching system 10 has been fabricated, tested, and found to be fully functional. Control circuitry 12 and GDSL1 and GDSL2 were all fabricated on a single semiconductor substrate using dielectric isolation. The circuitry fabricated also included a second pair of load gated diode switches with two additional transistors like Q1 and Q4. The cathode of GDSC of this fabricated circuitry was coupled to the anodes of a pair of additional diodes (not illustrated) which are similar to corresponding diodes illustrated in FIG. 4 of U.S. Pat. No. 4,250,409. which has a common assignee with the present application.

In the circuitry fabricated V++=+315 volts, V+=+275 volts, V1=+200 volts, V2=+200 volts, R1=18k ohms, R2=10k ohms, Vin "1"=+317.5 volts, Vin "0"=+312.8 volts, and GDSC, GDSL1, and GDSL2, all had the basic structure disclosed in the article entitled "A 500 V Monolithic Bidirectional 2×2 Crosspoint Array," 1980 *IEEE International Solid-State Circuits Conference—Digest of Technical Papers*, pages 170 and 171 and in copending U.S. patent application Ser. No. 248,192.

The embodiments described herein are intended to be illustrative of the general principles of the present invention. Various modifications are possible consistent with the spirit of the invention. For example, bipolar transistors Q1, Q2, Q3, and Q4 could be field effect transistors or other types of switching devices which can handle relatively high voltages and moderate currents. Q4 can be made a part of GDSL1 or GDSL2 as illustrated in U.S. patent application Ser. No. 107,776 (W. F. MacPherson-R. S. Scott-P. W. Shackle), filed Dec. 28, 1979 and having one common inventor and a common assignee with the present application. Still further, a transistor or other switching device can be substituted for D1. Still further, electrically or optically activated switches, as are illustrated in FIG. 4 of U.S. Pat. No. 4,250,409, can be inserted between D1 and power supply V+. Still further, with approximate leakages for GDSC and GDSL1 and/or GDSL2, R2, Q1, and Q4 could be eliminated, and circuitry 14 would still be functional. Still further, a current limiter or like means could be coupled between terminal 34 and terminals XO or YO or to a negative power supply and R2, Q1 and Q4 could be eliminated. Still further, GDSC and/or GDSL1 and/or GDSL2 could be replaced by switching devices, other than gated diode switches. Such switches would be characterized in that same require a high control voltage applied to a control terminal and the sourcing of current into the control terminal to interrupt (cut off) conduction between the output terminals thereof.

What is claimed is:

1. Control circuitry for use with a first switching device of the type comprising a semiconductor body having a bulk portion which is of relatively high resistivity, and a first region of a first conductivity type and of relatively low resistivity, and second and third regions of a second conductivity type opposite that of the first conductivity type, the first and third regions being connected to output terminals of the first switching device, the second region being coupled to a control terminal of the switching device, the first, second and third regions being mutually separated by portions of the bulk of the semiconductor body, a second switching device of the same type and essentially same electrical characteristics as said first switching device, an output terminal of the second switching device being coupled to the control terminal of the first switching device comprising:

third and fourth switching devices which each have a control terminal and first and second output terminals;

the control circuitry being capable of supplying up to a preselected level of current into the second switching device;

the control terminal of the third switching device and a first output terminal of the fourth switching device being coupled to a first control circuitry input terminal;

a second output terminal of the fourth switching device being coupled to a first output terminal of the second switching device;

the control terminal of the fourth switching device and the first output terminal of the third switching device being coupled together and being coupled to a second control circuitry terminal; and a second output terminal of the third switching device being coupled to the control terminal of the second switching device.

2. The control circuitry of claim 1 further comprising:

a branch circuit being coupled to the second switching device and being capable of supplying into the second switching device a substantially greater level of current than the preselected level, if, and only if, the level of current flow into the second switching device reaches the preselected level;

fifth and sixth switching devices which each have a control terminal and first and second output terminals and are capable of relatively high voltage operation;

the control terminal, the second output terminal, and the first output terminal, all of the fifth switching device being coupled to the control terminal of the third switching device, to the control terminal of the sixth switching device, and to the control terminal of the fourth switching device, respectively; and the first and second output terminals of the sixth switching device being coupled to one of the output terminals of the first switching device and to the second output terminal of the second switching device, respectively.

3. The control circuitry of claim 2 further comprising:

first and second resistance means each having a first and second terminal;

the first terminal of the first resistance means being coupled to the first control circuitry input terminal;

the second terminal of the first resistance means being coupled to the control terminals of the third and fifth switching devices and to the first output terminal of the fourth switching device;

the first terminal of the second resistance means being coupled to the first output terminal of the fifth switching device; and the second terminal of the second resistance means being coupled to the first output terminal of the third switching device and to the control terminal of the fourth switching device.

4. The control circuitry of claim 3 wherein:

the first and second switching devices are designed for high voltage and relatively high current operation;

the third, fourth, fifth, and sixth switching devices are designed for high voltage operation and to operate at lower current levels than the current levels than those which the second switching device is designed to operate at; and the first and second resistance means are first and second resistors.

5. Control ciruitry for use with a first switching device of the type comprising a semiconductor body having a bulk portion which is of a first conductivity type and is of a relatively high resistivity, a first region of a first conductivity type and of relatively low resistivity, and second and third regions of a second conductivity type opposite that of the first conductivity type, the first and third regions being connected to output terminals of the first switching device, the second region being coupled to a control terminal of the switching device, the first, second and third regions being mutually separated by portions of the bulk of the semiconductor body, a second switching device of the same type and essentially same electrical characteristics as said first switching device, an output terminal of the second switching device being coupled to the control terminal of the first switching device comprising:

third and fourth switching devices which each have a control terminal and first and second output terminals;

the control circuitry being capable of supplying up to a preselected level of current into the second switching device; and the control terminal of the third switching device and a first output terminal of the fourth switching device being coupled to a first control circuitry input terminal;

a second output terminal of the fourth switching device being coupled to a first output terminal of the second switching device;

the control terminal of the fourth switching device and the first output terminal of the third switching device being coupled together and being coupled to a second control circuitry terminal; and a second output terminal of the third switching device being coupled to the control terminal of the second switching device.

6. First branch control circuitry for use with a first high voltage and relatively high current capability switching device of the type comprising a semiconductor body having a bulk portion which is of a first conductivity type and is of relatively high resistivity, a first region of a first conductivity type and of a relatively low resistivity, and second and third regions of a second conductivity type opposite that of the first conductivity type, the first and third regions being connected to output terminals of the first switching device, the second region being coupled to a control terminal of the switching device, the first, second and third regions being mutually separated by portions of the bulk of the semiconductor body, a second high voltage and relatively high current capability switching device of the same type and essentially same electrical characteristics as said first switching device, an output terminal of the second switching device being coupled to the control terminal of the first switching device comprising:

third, fourth, fifth, and sixth switching devices which each have a control terminal and first and second output terminals;

the first branch control circuitry being capable of supplying up to a preselected level of current into the second switching device; and second branch control circuitry being coupled to the second switching device and being capable of supplying a greater level of current into the second switching device than the first branch circuit is capable of supplying, if, and only if, the level of current into the second switching device from the first branch circuit reaches the preselected level;

the control terminals of the third and fifth switching devices and a first output terminal of the fourth switching device being coupled to a first circuitry input terminal;

a second output terminal of the fourth switching device being coupled to a first output terminal of the second switching device and to the second branch control circuitry;

the second output terminal of the fifth switching device being coupled to the control terminal of the sixth switching device;

the second output terminal of the third switching device being coupled to the control terminal of the second switching device;

the second output terminal of the sixth switching device being coupled to a second output terminal of the second switching device and to the control terminal of the first switching device;

the first output terminal of the sixth switching device being coupled to a first output terminal of the first switching device; and the first output terminals of the third and fifth switching devices and the control terminal of the fourth switching device being coupled together and being coupled to a second circuitry terminal.

7. The circuitry of claim 6 wherein the second branch circuit comprises a seventh switching device which has first and second output terminals, the first output terminals of the seventh switching device being coupled to the first output terminal of the second high voltage switching device.

8. The circuitry of claim 7 further comprising:

first and second resistive means;

the first resistive means being coupled between the first circuitry input terminal and the common terminal of the control terminals of the third and fifth switching devices and the first output terminal of the fourth switching device; and the second resistive means being coupled between the first output terminal of the fifth switching device and a common terminal of the first output terminal of the third switching device and the control terminal of the fourth switching device.

9. The circuitry of claim 8 wherein the third, fourth, fifth, sixth and seventh switching devices are a p-n-p, p-n-p and, p-n-p type transistors, an n-p-n type transistor, and a p-n diode, respectively, and the first and second resistive means are both resistors.

10. The circuitry of claim 9 wherein the first and second switching devices are gated diode switches, the transistors are designed for relatively high voltage operation and to operate at lower current levels than those which the second switching device is designed to operate at, and the diode is adapted for relatively high voltage and current operation.

* * * * *